United States Patent
Hughes et al.

(10) Patent No.: US 9,192,277 B1
(45) Date of Patent: Nov. 24, 2015

(54) SQUEEGEE APPARATUS

(71) Applicants: Joseph D. Hughes, Winter Garden, FL (US); Rodney Wallace, Winter Garden, FL (US)

(72) Inventors: Joseph D. Hughes, Winter Garden, FL (US); Rodney Wallace, Winter Garden, FL (US)

( * ) Notice: Subject to any disclaimer, the term of this patent is extended or adjusted under 35 U.S.C. 154(b) by 0 days.

(21) Appl. No.: 13/921,649

(22) Filed: Jun. 19, 2013

Related U.S. Application Data

(60) Provisional application No. 61/661,504, filed on Jun. 19, 2012.

(51) Int. Cl.
*A47L 13/00* (2006.01)
*A47L 13/11* (2006.01)

(52) U.S. Cl.
CPC ...................... *A47L 13/11* (2013.01)

(58) Field of Classification Search
CPC ...... B05C 17/10; B05C 17/00; B05C 11/028; B05C 11/04; B05C 11/044; A47L 13/08; A47L 13/10; A47L 13/11; A47L 1/06; A47L 13/022; B26B 3/00
USPC ........... 15/245, 245.1, 236.01, 121, 105, 145; 294/65.5, 190
See application file for complete search history.

(56) References Cited

U.S. PATENT DOCUMENTS

| | | | |
|---|---|---|---|
| 2,697,642 A * | 12/1954 | Rudy | 403/410 |
| 7,712,179 B2 * | 5/2010 | Lemke | 15/236.01 |
| 2002/0100135 A1 * | 8/2002 | Machesky | 15/245 |
| 2004/0194245 A1 * | 10/2004 | Lee | 15/229.4 |

* cited by examiner

*Primary Examiner* — Laura C Guidotti
(74) *Attorney, Agent, or Firm* — Larry D. Johnson

(57) ABSTRACT

A squeegee apparatus including a handle with a magnetic blade receptacle to enable quick blade release and reload. When the squeegee blade becomes dull or damaged, the spent blade is pulled from the handle, and a new blade can be positioned and magnetically pulled into the blade cradle ready for use. An internal LED light source that is actuated by a button located on the handle can be used to illuminate the work space.

8 Claims, 2 Drawing Sheets

SQUEEGEE APPARATUS

CROSS REFERENCE TO RELATED APPLICATIONS

The present application claims the benefit of the filing date of U.S. Provisional Patent Application Ser. No. 61/661,504, filed Jun. 19, 2012. The foregoing application is incorporated by reference in its entirety as if fully set forth herein.

STATEMENT REGARDING FEDERALLY SPONSORED RESEARCH OR DEVELOPMENT

Not applicable.

REFERENCE TO A MICROFICHE APPENDIX

Not applicable.

TECHNICAL FIELD

The present invention relates generally to squeegees, and more specifically to an improved squeegee apparatus for use in a variety of industries, and in particular, the graphics industry.

BACKGROUND INFORMATION AND DISCUSSION OF RELATED ART

Squeegees are versatile tools that are used in a variety of industries, but suffer from numerous drawbacks. For example, currently when a squeegee blade gets nicked or rounded the blade is rendered useless for it's intended primary use, and even when the blade is then flipped over to use the other side, the same limitation applies to that side as well.

There are many different squeegees in use today from rigid plastic to Teflon coated or felt coated ones, however, they all share the same problems: the blades gets dull after only a few uses; they are not designed well for use by the human hand; the edge cuts uncomfortably into the user's palm even after limited use; they are not comfortable to use; they are too small when laying large graphics; they do nothing to enhance visibility in low light conditions; they do not have and extensive useful life; and they can be expensive over time (e.g., $2.00-$12.00 per squeegee).

The foregoing information reflect the current state of the art of which the present inventor is aware. Reference to, and discussion of, this information is intended to aid in discharging Applicant's acknowledged duty of candor in disclosing information that may be relevant to the examination of claims to the present invention. However, it is respectfully submitted that none of the above-indicated information discloses, teaches, suggests, shows, or otherwise renders obvious, either singly or when considered in combination, the invention described and claimed herein.

SUMMARY OF THE INVENTION

The squeegee apparatus of the present invention provides an improved squeegee with numerous features and benefits over prior art squeegees. First, the inventive apparatus provides a handle with a magnetic blade receptacle to enable quick blade release and reload. When the squeegee blade becomes dull or damaged, approximately 7.5 lbs. of pull pressure releases the spent blade from the handle, and then the new blade can be positioned and magnetically pulled into the blade cradle ready for use. The blades may be numbered for quick reference according to thickness, rigidity, and use factors, and may also be color coded to facilitate visually identifying the correct blade each time.

The entire lower portion of the device provides illumination with a brilliant white light from an internal LED light source that is actuated with only a press of a button located on the user side, and which is recessed to avoid accidental turn on. The light can be used to illuminate the entire work space for an extended period of time.

The squeegee blades are designed with a 35 degree forward pitch to get into places you can't currently get into with industry standard squeegees. A pointed, sharper blade makes for easier application with less down force.

The squeegee handle enables a variety of different grip positions, depending on the direction of the user's hand. It's completely ergonomic design adds comfort and style to any user, novice or seasoned professional, with ease of use and overall simplicity for graphic applicators.

The 100% silicone handle and grips make it less likely to slip and ruin the graphic application, and is far more comfortable to the user than traditional devices.

When spent blades are accumulated they can also be reclaimed for further use, thereby saving the user money and reducing product loss.

The device may be packaged and shipped with a portable belt case, a blade sharpener and one or more miscellaneous blades. The device may used with a variety of optional blades ranging from a hard plastic scraper blade for removal of old vinyl to a soft felt coated blade for delicate surfaces. Other blades may be designed and produced in each field as they are needed.

Primary applications for use of the inventive squeegee include but are not limited to: application of vinyl films; application of window tinting film; removal of films; scraping and removal of vinyl; transfer of vinyl media to substrates; removal of liquids from substrate surfaces; cleaning substrates; plastic body filler applications; and fiberglass body filler applications.

It is therefore an object of the present invention to provide a new and improved squeegee apparatus.

It is another object of the present invention to provide a new and improved squeegee that facilitates blade removal and exchange.

A further object or feature of the present invention is a new and improved squeegee apparatus that can illuminate a work surface.

Other novel features which are characteristic of the invention, as to organization and method of operation, together with further objects and advantages thereof will be better understood from the following description considered in connection with the accompanying drawings, in which preferred embodiments of the invention are illustrated by way of example. It is to be expressly understood, however, that the drawings are for illustration and description only and are not intended as a definition of the limits of the invention. The various features of novelty which characterize the invention are pointed out with particularity in the claims annexed to and forming part of this disclosure. The invention resides not in any one of these features taken alone, but rather in the particular combination of all of its structures for the functions specified.

There has thus been broadly outlined the more important features of the invention in order that the detailed description thereof that follows may be better understood, and in order that the present contribution to the art may be better appreciated. There are, of course, additional features of the invention that will be described hereinafter and which will form additional subject matter of the claims appended hereto. Those skilled in the art will appreciate that the conception upon which this disclosure is based readily may be utilized as a basis for the designing of other structures, methods and systems for carrying out the several purposes of the present invention. It is important, therefore, that the claims be regarded as including such equivalent constructions insofar as they do not depart from the spirit and scope of the present invention.

Further, the purpose of the Abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The Abstract is neither intended to define the invention of this application, which is measured by the claims, nor is it intended to be limiting as to the scope of the invention in any way.

Certain terminology and derivations thereof may be used in the following description for convenience in reference only, and will not be limiting. For example, words such as "upward," "downward," "left," and "right" would refer to directions in the drawings to which reference is made unless otherwise stated. Similarly, words such as "inward" and "outward" would refer to directions toward and away from, respectively, the geometric center of a device or area and designated parts thereof. References in the singular tense include the plural, and vice versa, unless otherwise noted.

BRIEF DESCRIPTION OF THE DRAWINGS

The invention will be better understood and objects other than those set forth above will become apparent when consideration is given to the following detailed description thereof. Such description makes reference to the annexed drawings wherein.

DETAILED DESCRIPTION OF THE INVENTION

Figure 1:
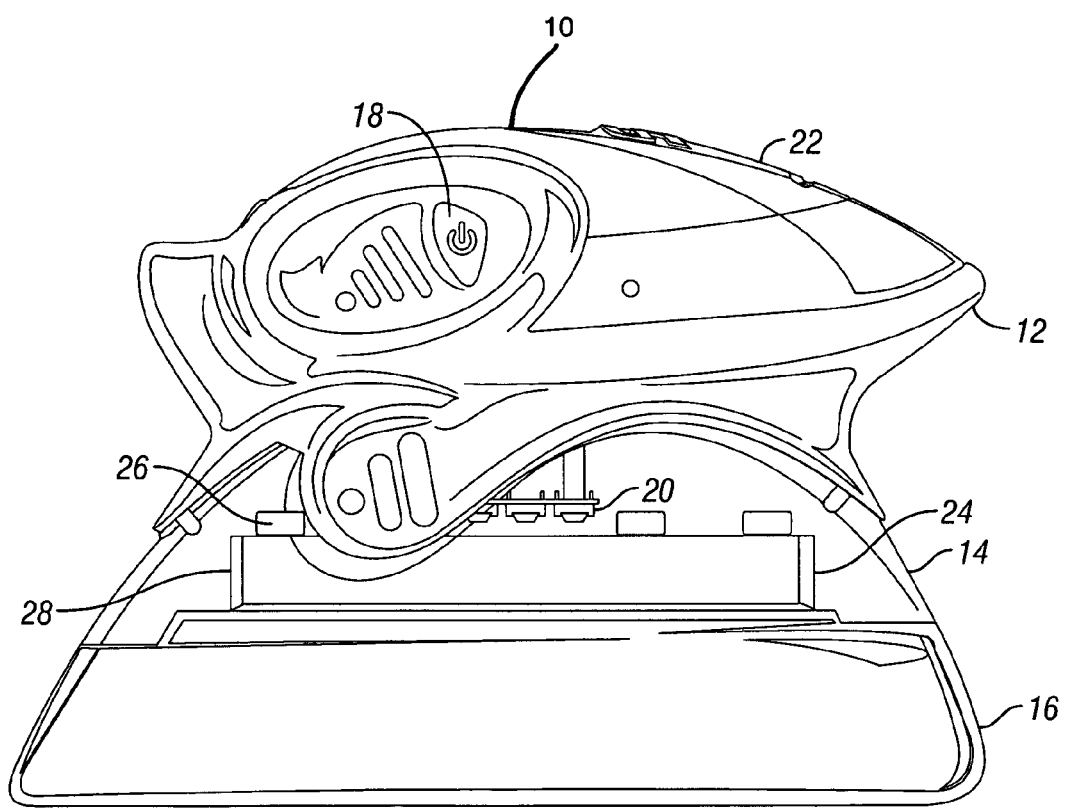
FIG. 1 is a left side elevation view of a squeegee apparatus of this invention with a squeegee blade installed for use.
Figure 2:
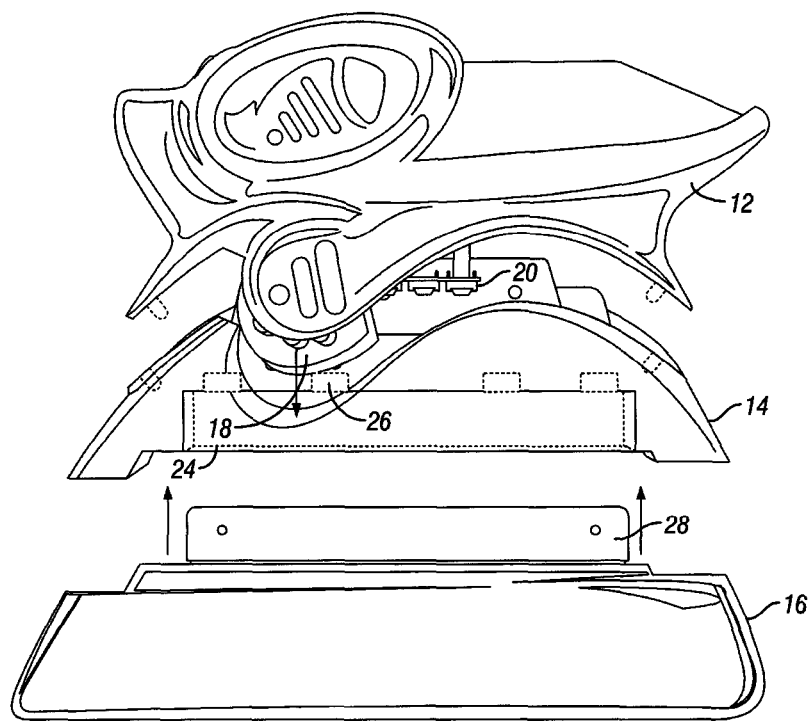
FIG. 2 is a left side exploded view of the apparatus with the squeegee blade removed.

Referring to FIGS. 1 and 2, wherein like reference numerals refer to like components in the various views, there is illustrated therein a new and improved squeegee apparatus, generally denominated 10 herein.

FIG. 1 is a left side elevation view of the apparatus 10, illustrating a handle 12, housing 14 (which may be integral with the handle), and blade 16. The handle 12 may be constructed of ABS plastic or similar material, and is ergonomically designed for comfort and ease of use. For example, the handle may be textured for grip, contoured to give ergonomic support to the user's fingers and thumb, and shaped to facilitate application of pressure when needed. The handle includes a recessed light power switch 18 such as a push button on/off plunger switch to activate the internal LED lights 20 (described below), and may be covered by a silicone rubber cover piece. The handle may also include lid portions or "skins" 22, e.g., constructed of Shore 60D silicone rubber or plastic coated rubber, and textured for optimum grip.

Housing 14 may be constructed of urethane, acrylic, or other suitable material, and includes LED lights 20, such as 0.12 amp super bright white wide spectrum LEDs, which are directed to light the work surface to facilitate use in low or no light conditions, and are powered by a battery such as an A23 12 volt battery in the handle (not illustrated). Opaque or translucent surface finish may be applied to the housing to diffuse the internal LED light, while clear areas may direct light towards the blade and working surface. Blade receptacle 24 is formed in the housing 14 and includes one or more magnets 26 such as four nickel plated neodymium 8 mm×3 mm disc magnets along a top edge thereof. The magnets may be encapsulated within the housing during fabrication.

Blade 16 includes a metallic (e.g., steel) cap 28 that fits into the blade receptacle 24 and mates with the magnets 26 to releasably fix the blade assembly to the handle for use. Steel cap 28 is preferably molded into Teflon or plastic polymer flexible squeegee blade 16 by overmolding or injection molding. Each preferably bear structural mating features to enhance bonding. Blade 16 preferably includes a forward pitch of approximately 35 degrees to extend reach of the blade.

Overall dimensions of the assembled apparatus may be approximately 5 inches long, 1.25 inches wide, and 2.75 inches high.

FIG. 2 is a left side exploded view of the apparatus with the squeegee blade 16 removed. The handle 12 may be separable from housing 14 as illustrated, or the parts may be formed as an integral unit. The blade 16 is retained in the housing 14 by the force of the magnets 26 (e.g., approximately 7.5 lbs. of pulling force), but may be readily removed from the housing as needed by the user, and replaced with another blade as needed.

The squeegee blades 16 are designed for a deep angle, softness for non marring, and rigidity for maximum pressure and flexibility. The blades may be constructed of a variety of materials including Teflon, soft plastic, rubber, stainless steel, felt, fabric, flock, hard plastic, clear rubber, nylon, Kevlar, sand embedded (various grit), or steel wool (various grit); and be smooth, serrated, or hooked. Blade types, number and uses may include, but are not limited to: 1) stainless steel scraper blade (vinyl removal); 2) sharp ABS rigid plastic scraper (vinyl removal from painted surfaces); 3) softer ABS plastic scraper (adhesive remover from custom paint); 4) hard rubber squeegee blade (fleet graphics); 5) medium rubber squeegee blade (wraps); 6) soft rubber squeegee blade (high performance applicator); 7) rigid Teflon blade (transferring); 8) composite Teflon blade (everyday use); 9) soft Teflon (non marring); 10) felt blade (dull over laminate wraps); 11) flexible rubber for corrugated surfaces (uneven panels); 12) body filler blade (fiber glassing); 13) serrated blade (cutting trimming); 14) vinyl slitter hook blade (slitting/cutting); 15) window tinting silicone rubber blade; 16) window cleaning smooth rubber blade (window squeegee); and 17) scoring blade for cutting/scoring PVC and acrylic.

Features and options for the inventive squeegee apparatus include, but are not limited to, the following:

Quick change magnetic blades, with blades that eject and replace in a matter of seconds due to the magnetic device within the handle.

Illuminated for use in diminished or no light conditions (self powered), with various LED colors available for various lighting challenges.

35 degree forward pitched pointed blades for tight places.

Ergonomic design for comfort, designed for all hand sizes, enabling a variety of different grip positions for maximum comfort when applying pressure during use.

Solvent proof construction.

Long lasting blades.

Unlimited number of blade configurations.

Custom skins (silicone jackets) available, e.g., skulls, flames, vector flowers, vines, etc.

The above disclosure is sufficient to enable one of ordinary skill in the art to practice the invention, and provides the best mode of practicing the invention presently contemplated by the inventor. While there is provided herein a full and complete disclosure of the preferred embodiments of this invention, it is not desired to limit the invention to the exact construction, dimensional relationships, and operation shown and described. Various modifications, alternative constructions, changes and equivalents will readily occur to those skilled in the art and may be employed, as suitable, without departing from the true spirit and scope of the invention. Such changes might involve alternative materials, components, structural arrangements, sizes, shapes, forms, functions, operational features or the like.

Therefore, the above description and illustrations should not be construed as limiting the scope of the invention, which is defined by the appended claims.

What is claimed as invention is:

1. A squeegee apparatus comprising:
    a handle portion including a blade receptacle bearing a plurality of magnets along a top edge of said blade receptacle;
    a blade assembly including a metallic cap and a flexible blade, said metallic cap substantially coextensive with a top edge of said flexible blade, wherein said metallic cap can be releasably affixed to said blade receptacle by said plurality of magnets to attach said blade assembly to said handle portion.

2. The squeegee apparatus of claim 1 wherein said handle portion includes a light actuated by a switch on said handle portion.

3. The squeegee apparatus of claim 2 wherein said switch is recessed to prevent inadvertent activation.

4. The squeegee apparatus of claim 2 wherein said light is directed towards said blade assembly and a working surface.

5. The squeegee apparatus of claim 1 wherein said handle portion includes surface texture to facilitate gripping by a user.

6. The squeegee apparatus of claim 1 wherein said handle portion is contoured to give ergonomic support to the user's fingers and thumb.

7. The squeegee apparatus of claim 1 wherein said metallic cap is molded into said flexible blade.

8. The squeegee apparatus of claim 1 wherein said flexible blade includes a 35 degree forward pitch.

* * * * *